(12) United States Patent
Su et al.

(10) Patent No.: US 11,261,328 B2
(45) Date of Patent: Mar. 1, 2022

(54) CIRCUIT BOARD USING LOW DIELECTRIC RESIN COMPOSITION

(71) Applicant: Zhen Ding Technology Co., Ltd., Taoyuan (TW)

(72) Inventors: Szu-Hsiang Su, Taoyuan (TW); Shou-Jui Hsiang, Tayuan (TW); Mao-Feng Hsu, Taoyuan (TW); Ming-Jaan Ho, Taoyuan (TW)

(73) Assignee: Zhen Ding Technology Co., Ltd., Taoyuan (TW)

( * ) Notice: Subject to any disclaimer, the term of this patent is extended or adjusted under 35 U.S.C. 154(b) by 0 days.

(21) Appl. No.: 17/121,616

(22) Filed: Dec. 14, 2020

(65) Prior Publication Data

US 2021/0102067 A1  Apr. 8, 2021

Related U.S. Application Data

(62) Division of application No. 15/871,141, filed on Jan. 15, 2018, now Pat. No. 10,894,882.

(51) Int. Cl.

| | |
|---|---|
| *C08L 79/08* | (2006.01) |
| *C08L 51/00* | (2006.01) |
| *C08J 3/24* | (2006.01) |
| *C08L 51/08* | (2006.01) |
| *H05K 1/03* | (2006.01) |
| *C08J 5/18* | (2006.01) |
| *H05K 3/38* | (2006.01) |

(52) U.S. Cl.
CPC .............. *C08L 79/08* (2013.01); *C08J 3/246* (2013.01); *C08J 5/18* (2013.01); *C08L 51/003* (2013.01); *C08L 51/006* (2013.01); *C08L 51/08* (2013.01); *H05K 1/0373* (2013.01); *C08J 2351/00* (2013.01); *C08J 2351/04* (2013.01); *C08J 2351/06* (2013.01); *C08J 2351/08* (2013.01); *C08J 2379/08* (2013.01); *C08J 2447/00* (2013.01); *C08J 2463/00* (2013.01); *C08J 2471/12* (2013.01); *C08L 2203/20* (2013.01); *C08L 2205/03* (2013.01); *C08L 2312/00* (2013.01); *H05K 3/386* (2013.01); *H05K 2201/0104* (2013.01); *H05K 2201/0154* (2013.01)

(58) Field of Classification Search
CPC .............................................. H05K 2201/0154
See application file for complete search history.

(56) References Cited

U.S. PATENT DOCUMENTS

| | | |
|---|---|---|
| 2011/0303438 A1 | 12/2011 | Matsuyama et al. |
| 2016/0137890 A1 | 5/2016 | Li |

FOREIGN PATENT DOCUMENTS

TW  201736118 A  10/2017

*Primary Examiner* — Ian A Rummel
(74) *Attorney, Agent, or Firm* — ScienBiziP, P.C.

(57) ABSTRACT

A circuit board includes an insulating made by a low dielectric resin composition includes a low dielectric resin containing acid anhydride, an epoxy resin, polyphenylene ether resin with vinyl and active esters, maleic acid liquid polybutadiene, and an accelerator. Such low dielectric resin can be dissolved in organic solvent more easily than a low dielectric resin without acid anhydride, and the low dielectric resin containing acid anhydride has a better compatibility with other organic components than a low dielectric resin without acid anhydride. A low dielectric resin composition with lower dielectric constant and better properties can thus be obtained.

10 Claims, 3 Drawing Sheets

CIRCUIT BOARD USING LOW DIELECTRIC RESIN COMPOSITION

CROSS-REFERENCE TO RELATED APPLICATIONS

This is a divisional application of patent application Ser. No. 15/871,141, filed on Jan. 15, 2018, assigned to the same assignee, which is based on and claims priority to Taiwan Patent Application No. 106108432 filed on Mar. 15, 2017, the contents of which are incorporated by reference herein.

FIELD

The subject matter herein generally relates to a low dielectric resin composition, a film made by the low dielectric resin composition, and a circuit board using the low dielectric resin composition.

BACKGROUND

A circuit board generally includes a conductive circuit and an insulating layer adjacent to the conductive circuit. The dielectric constant of the insulating layer is an important factor of impedance matching. Impedance matching can allow high frequency signal at a high speed. The insulating layer is made of resin composition. In order to realize high speed of high frequency signals, a resin composition having a low dielectric constant is needed.

BRIEF DESCRIPTION OF THE DRAWINGS

Implementations of the present disclosure will now be described, by way of example only, with reference to the attached figures.

DETAILED DESCRIPTION

Figure 1:
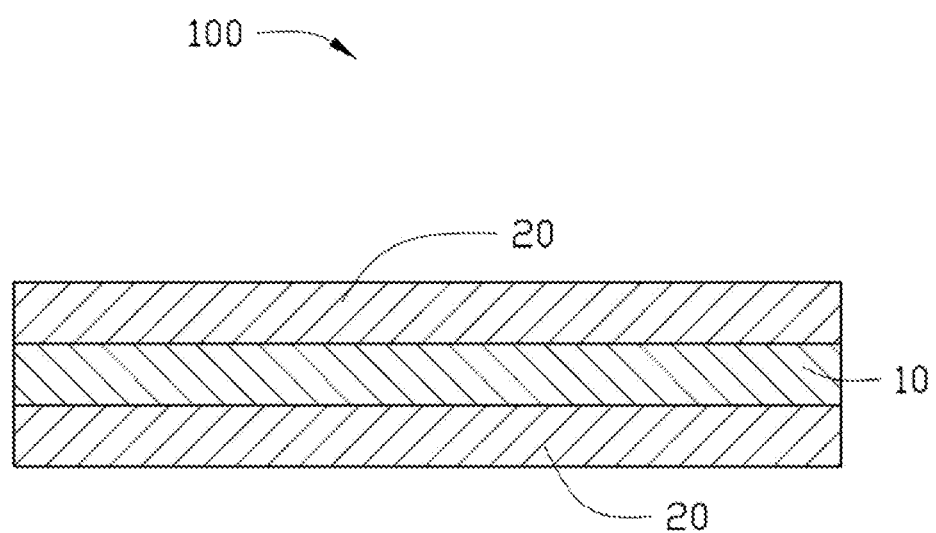
FIG. 1 is a cross-sectional view of a film in accordance with an exemplary embodiment.

It will be appreciated that for simplicity and clarity of illustration, where appropriate, reference numerals have been repeated among the different figures to indicate corresponding or analogous elements. In addition, numerous specific details are set forth to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better. The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising" when utilized, means "including, but not necessarily limited to"; it specifically indicates open-ended inclusion or membership in the so-described combination, group, series, and the like. The term "about" when utilized, means "not only includes the numerical value, but also includes numbers closest to the numerical value".

In an exemplary embodiment, a low dielectric resin composition comprises a low dielectric resin containing acid anhydride, an epoxy resin, a rigid cross-linking agent, a soft cross-linking agent, and an accelerator.

In at least one exemplary embodiment, the low dielectric resin composition comprises: 100 parts by weight of the low dielectric resin containing acid anhydride, 5-30 parts by weight of the epoxy resin, 5-50 parts by weight of the rigid cross-linking agent, 5-50 parts by weight of the soft cross-linking agent, and 0.1-5 parts by weight of the accelerator.

In at least one exemplary embodiment, the low dielectric resin composition has a dielectric constant $(D_k)$ that is less than 2.4, and the polyimide has a dielectric loss $(D_f)$ that is less than 0.004.

The low dielectric resin containing acid anhydride can be dissolved in organic solvent more easily than a low dielectric resin without acid anhydride, and the low dielectric resin containing acid anhydride has better compatibility with other organic components than low dielectric resin without acid anhydride. A low dielectric resin composition with lower dielectric constant and better properties can thus be obtained.

The low dielectric resin containing acid anhydride may be selected from maleic anhydride graft modified resin, polyimide resin containing anhydride, or combination thereof. The maleic anhydride graft modified resin may be selected from maleic anhydride graft styrene-ethyl-butene-styrene block copolymer (SEBS-g-MA), maleic anhydride graft cyclo-olefin polymer (EPDM-g-MA), maleic anhydride graft ethylene propylene diene monomer, or any combination thereof.

In at least one exemplary embodiment, the low dielectric resin containing acid anhydride has a dielectric constant $(D_k)$ that is less than 3.

A chemical structure formula of the SEBS-g-MA is:

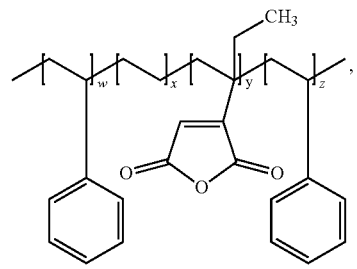

wherein, the w, x, y, and z are positive integers.

A chemical structure formula of the COC-g-MA is:

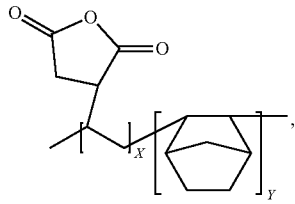

wherein, the X and Y are positive integers.

A chemical structure formula of the EPDM-g-MA is:

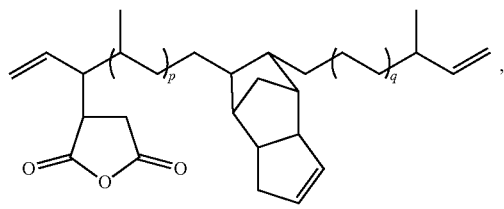

wherein, the p and q are positive integers.

The epoxy resin is a special epoxy resin. The special epoxy resin may be an epoxy resin containing more than two epoxy groups, or an epoxy resin containing vinyl. The epoxy resin may be selected from 1,3-bis(oxiranylmethyl)-5-(2-propenyl)-1,3,5-Triazine-2,4,6(1H,3H,5H)-trione, 1-(oxiranylmethyl)-3,5-di-2-propenyl-1,3,5-Triazine-2,4,6(1H,3H,5H)-trione, 1,3,5-Triglycidyl isocyanurate, 3-Benzenedimethanamine, N,N,N',N'-tetrakis(oxiranylmethyl)-1, 2,2',2",2'''-[1,2-ethanediylidenetetrakis(4,1-phenyleneoxymethylene)]tetrakis-Oxirane, or any combination thereof.

A chemical structure formula of the 1,3-bis(oxiranylmethyl)-5-(2-propenyl)-1,3,5-Triazine-2,4,6(1H,3H,5H)-trione is:

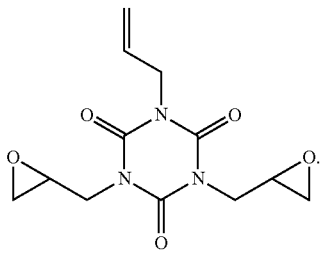 [SMILES: C=CCn1c(=O)n(CC2CO2)c(=O)n(CC2CO2)c1=O]

A chemical structure formula of the 1-(oxiranylmethyl)-3,5-di-2-propenyl-1,3,5-Triazine-2,4,6(1H,3H,5H)-trione is:

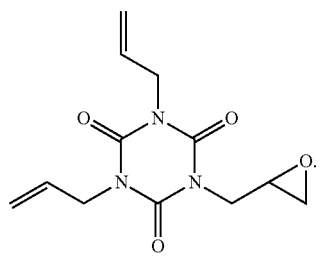 [SMILES: C=CCn1c(=O)n(CC=C)c(=O)n(CC2CO2)c1=O]

A chemical structure formula of the 1,3,5-Triglycidyl isocyanurate, 3-Benzenedimethanamine is:

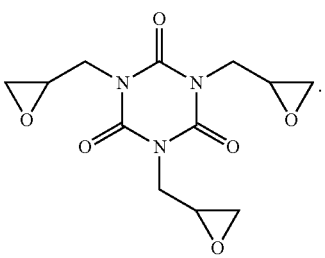 [SMILES: O=c1n(CC2CO2)c(=O)n(CC2CO2)c(=O)n1CC1CO1]

A chemical structure formula of the N,N,N',N'-tetrakis(oxiranylmethyl)-1

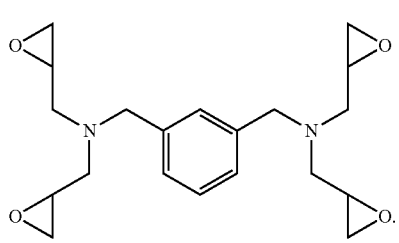 [SMILES: c1cc(CN(CC2CO2)CC2CO2)cc(CN(CC2CO2)CC2CO2)c1]

A chemical structure formula of the 2,2',2",2'''-[1,2-ethanediylidenetetrakis(4,1-phenyleneoxymethylene)]tetrakis-Oxirane is:

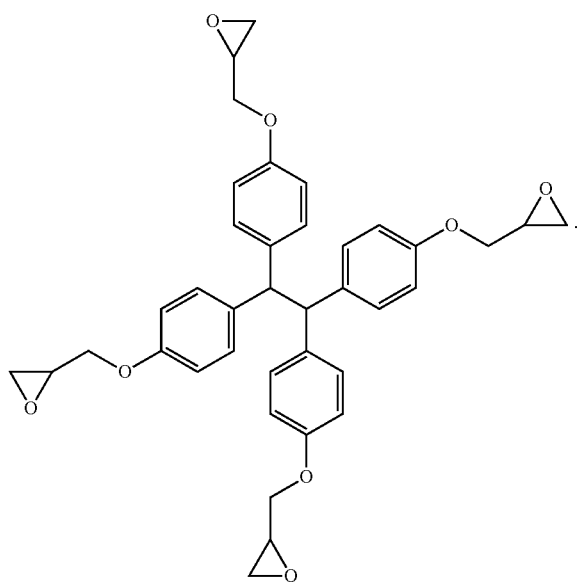 [SMILES: c1cc(C(c2ccc(OCC3CO3)cc2)C(c2ccc(OCC3CO3)cc2)c2ccc(OCC3CO3)cc2)ccc1OCC1CO1]

The rigid cross-linking agent may be polyphenylene ether resin with vinyl and active esters. In at least one exemplary embodiment, the polyphenylene ether resin with vinyl and active esters has a molecular weight of about 1500 g/mol to about 2500 g/mol. The rigid cross-linking agent can adjust a hardness of a film formed by the low dielectric resin composition.

The soft cross-linking agent may be maleic acid liquid polybutadiene. The maleic acid liquid polybutadiene has a molecular weight of about 2000 g/mol to about 8000 g/mol. The soft cross-linking agent can adjust compliancy of a film formed by the low dielectric resin composition.

A chemical structure formula of the maleic acid liquid polybutadiene is:

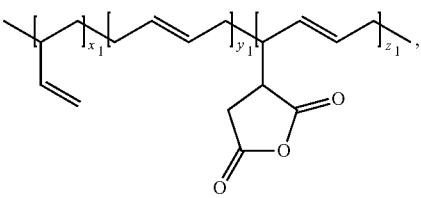

wherein, the $x_1$, $y_1$, and $z_1$ are positive integers.

The epoxy groups of the epoxy resin can undergo a cross-linking with the acid anhydride in the low dielectric resin containing acid anhydride, the active esters in the rigid cross-linking agent, and the acid anhydride in the soft cross-linking agent. The low dielectric resin containing acid anhydride, the rigid cross-linking agent, and the soft cross-linking agent are thus connected together, to form a low dielectric resin composition with high heat resistance and high cross-linking density.

The accelerator may be an epoxy and anhydride reaction accelerator. The epoxy and anhydride reaction accelerator may be selected from tertiary amine accelerator, organic phosphine derivative, or combination thereof.

The tertiary amine accelerator may be selected from N,N-Dimethylbenzylamine, N,N-dimethylaniline, triethylamine, or any combination thereof.

The organic phosphine derivative may be selected from Allyltri-n-butylphosphonium bromide ($C_{15}H_{32}P.Br$), Dodecyltributylphosphonium bromide ($C_{24}H_{52}BrP$), ltrioctylphosphonium bromide ($C_{26}H_{56}BrP$), Tributylhexadecylphosphonium bromide ($C_{28}H_{60}BrP$), Methyltributylphosphonium iodide ($C_{13}H_{30}IP$), Tetraethylphosphonium Bromide ($C_8H_{20}BrP$), Tetraethylphosphonium hydroxide ($C_8H_{21}OP$), Tetrabutylphosphonium bromide ($C_{16}H_{36}BrP$), Tetra-n-butylphosphonium chloride ($C_{16}H_{36}ClP$), Tetra-n-butylphosphonium O,O-Diethylphosphorodithioate ($C_{20}H_{46}OP_2S_2$), Tetra-n-butylphosphonium Benzotriazolate ($C_{22}H_{40}N_3P$), Tris(2-carboxyethyl)phosphinehydrochloride ($C_9H_{16}ClO_6P$), or any combination thereof.

In at least one exemplary embodiment, the low dielectric resin composition further comprises a thermal initiator. The low dielectric resin composition comprises 0.1~5 parts by weight of the thermal initiator.

The thermal initiator is an organic peroxide. An endothermic peak of the organic peroxide as measured by differential scanning calorimeter (DSC) is in the range from about 100 centigrade to about 200 centigrade. When heated, the thermal initiator decomposes to produce free radicals, the free radicals and the vinyl react as an initiating reaction.

The organic peroxide may be selected from peroxide with two acyl groups (RCOOOOCR'), peroxy ketal, peroxydicarbonate (ROCOOOOCOR'), peroxide ester (RCOOOR'), ketone peroxide ($[R_2C(OOH)_2]$), peroxide with two alkyl groups (ROOR'), peroxide of hydrogen (ROOH), or any combination thereof.

The peroxide with two acyl groups may be selected from isononanoic acid peroxide, capryl peroxide, lauroyl peroxide, p-chorobenzpyl peroxide, 3,5,5-Trimethylhexanoyl peroxide, or any combination thereof.

The peroxy ketal may be 2,2-bis(4,4-di-tert-Butyldioxycyclohexyl)propane.

The peroxydicarbonate may be selected from peroxydicarbonic acid, bis(3-methoxybutyl) ester, dicyclohexyl peroxydicarbonate, or any combination thereof.

The peroxide ester may be selected from tert-Butyl perbenzoate, acetyl tert-butyl peroxide, tert-Butyl peroxy-2-ethylhexanoate, tert-Butyl2-methylpropaneperoxoate, 2,2-Dimethylpropaneperoxoic acid 1,1-dimethylethyl ester, cumyl peroxyneodecanoate, tert-Butyl peroxybenzoate, 1,1,3,3-Tetramethylbutylperoxy-2-ethylhexanoate, 2,5-Dimethyl-2,5-bis(benzoylperoxy)hexane, or any combination thereof.

The ketone peroxide may be selected from 2-butanone peroxide, 1-[(1-hydroperoxycyclohexyl) dioxy]-cyclohexanol, or combination thereof.

The peroxide with two alkyl groups may be selected from di-t-butyl peroxide, bis(1-methyl-1-phenylethyl) peroxide, Bis(tert-butyldioxyisopropyl)benzene, 1,1-di-(tert-butylperoxy)-3,3,5-trimethylcyclohexane, tert butyl peroxide, bis(tert-butyldioxyisopropyl)benzene, or any combination thereof.

The peroxide of hydrogen may be selected from cumyl hydroperoxide, tert-butyl hydroperoxide, hydrogen peroxide p-menthane, or any combination thereof.

In at least one embodiment, the organic peroxide is selected from a group consisting of peroxide ester and peroxide with two alkyl groups. The peroxide ester is selected from a group consisting of tert-butyl perbenzoate, 1,1,3,3-tetramethylbutyl ester and bis(tert-butyldioxyisopropyl)benzene.

The low dielectric resin composition further comprises a lubricant, a filler, and a flame retardant or an ion trapping agent.

The low dielectric resin composition further comprises a solvent. The solvent may be toluene. The amount of the solvent may be adjusted, ensuring that all the above components dissolve in the solvent.

A method for preparing the low dielectric resin composition may include the following steps. First, providing a low dielectric resin containing acid anhydride, an epoxy resin, a rigid cross-linking agent, a soft cross-linking agent, a accelerator, and a thermal initiator. Second, providing a vessel. Third, adding the low dielectric resin containing acid anhydride, the epoxy resin, the rigid cross-linking agent, the soft cross-linking agent, the accelerator and the thermal initiator into the vessel. Fourth and finally, adding a solvent into the vessel and stirring, until the low dielectric resin containing acid anhydride, the epoxy resin, the rigid cross-linking agent, the soft cross-linking agent, the accelerator and the thermal initiator are completely dissolved in the solvent.

FIG. 1 illustrates an embodiment of a film 100 made by the low dielectric resin composition. The film 100 includes a resin layer 10 and a release film 20 attached to at least one surface of the resin layer 10. The film 100 is made by coating the low dielectric resin composition on at least one surface of the release film 20, and then drying the low dielectric resin composition to form the at least one resin layer 10.

Figure 2:
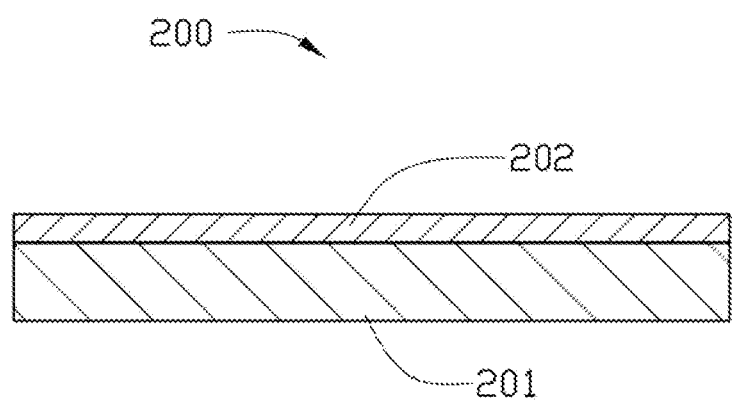
FIG. 2 is a cross-sectional view of a circuit board in accordance with an exemplary embodiment.

FIG. 2 illustrates an embodiment of a circuit board 200 made by the film 100. The circuit board 200 includes a circuit substrate 201 and an insulating layer 202 attached to at least one surface of the circuit substrate 201.

A method for making the circuit board 200 may include the steps of, first, sticking the resin layer 10 of the film 100 to one surface of the circuit substrate 201, second, removing the release film 20 of the film 100, and third heating the resin layer 10 to form an insulating layer 202.

The low dielectric resin composition has a low dielectric constant, a low dielectric loss, a high heat resistance, and a high cross-linking density The insulating layer 202 thus has a low dielectric constant, a low dielectric loss, a high heat resistance, and a high cross-linking density. The chemical cross-linking network structure in the insulating layer 202 is stable enough to allow soldering on the circuit board 200, having heat resistance.

Example 1

100 g COC-g-MA, 20 g polyphenylene ether resin with vinyl and active esters (SABIC, SA9000), 15 g maleic acid liquid polybutadiene (Cray valley Ricon, 130MA13), 5 g 1,3-bis(oxiranylmethyl)-5-(2-propenyl)-1,3,5-Triazine-2,4,6(1H,3H,5H)-trione, 1 g Bis(tert-butyldioxyisopropyl)benzene, 1 g Tetra-n-butylphosphonium O,O-Diethylphosphorodithioate, and 568 g toluene were added into a 1000 ml vessel, and stirred to have all the above components dissolved, to form a low dielectric resin composition.

Example 2

100 g EPDM-g-MA, 20 g polyphenylene ether resin with vinyl and active esters (SABIC, SA9000), 15 g maleic acid liquid polybutadiene (Cray valley Ricon, 130MA13), 5 g 1,3-bis(oxiranylmethyl)-5-(2-propenyl)-1,3,5-Triazine-2,4,6(1H,3H,5H)-trione, 1 g Bis(tert-butyldioxyisopropyl)benzene, 1 g Tetra-n-butylphosphonium O,O-Diethylphosphorodithioate, and 568 g toluene were added into a 1000 ml vessel, and stirred to have all the above components dissolved, to form a low dielectric resin composition.

Example 3

100 g polyimide resin containing anhydride, 20 g polyphenylene ether resin with vinyl and active esters (SABIC, SA9000), 15 g maleic acid liquid polybutadiene (Cray valley Ricon, 130MA13), 5 g 1,3-bis(oxiranylmethyl)-5-(2-propenyl)-1,3,5-Triazine-2,4,6(1H,3H,5H)-trione, 1 g Bis(tert-butyldioxyisopropyl)benzene, 1 g Tetra-n-butylphosphonium O,O-Diethylphosphorodithioate, and 568 g toluene were added into a 1000 ml vessel, and stirred to have all the above components dissolved, to form a low dielectric resin composition.

Example 4

100 g SEBS-g-MA, 20 g polyphenylene ether resin with vinyl and active esters (SABIC, SA9000), 15 g maleic acid liquid polybutadiene (Cray valley Ricon, 130MA13), 5 g 1,3-bis(oxiranylmethyl)-5-(2-propenyl)-1,3,5-Triazine-2,4,6(1H,3H,5H)-trione, 1 g Bis(tert-butyldioxyisopropyl)benzene, 1 g Tetra-n-butylphosphonium O,O-Diethylphosphorodithioate, and 568 g toluene were added into a 1000 ml vessel, and stirred to have all the above components dissolved, to form a low dielectric resin composition.

Example 5

100 g SEBS-g-MA, 30 g polyphenylene ether resin with vinyl and active esters (SABIC, SA9000), 15 g maleic acid liquid polybutadiene (Cray valley Ricon, 130MA13), 5 g 1,3-bis(oxiranylmethyl)-5-(2-propenyl)-1,3,5-Triazine-2,4,6(1H,3H,5H)-trione, 1 g Bis(tert-butyldioxyisopropyl)benzene, 1 g Tetra-n-butylphosphonium O,O-Diethylphosphorodithioate, and 608 g toluene were added into a 1000 ml vessel, and stirred to have all the above components dissolved, to form a low dielectric resin composition.

Example 6

100 g SEBS-g-MA, 20 g polyphenylene ether resin with vinyl and active esters (SABIC, SA9000), 30 g maleic acid liquid polybutadiene (Cray valley Ricon, 130MA13), 5 g 1,3-bis(oxiranylmethyl)-5-(2-propenyl)-1,3,5-Triazine-2,4,6(1H,3H,5H)-trione, 1 g Bis(tert-butyldioxyisopropyl)benzene, 1 g Tetra-n-butylphosphonium O,O-Diethylphosphorodithioate, and 628 g toluene were added into a 1000 ml vessel, and stirred to have all the above components dissolved, to form a low dielectric resin composition.

Comparative Example 1

100 g COC-g-MA and 400 g toluene were added into a 1000 ml vessel, and stirred to have all the above components dissolved, to form a resin composition.

Comparative Example 2

100 g EPDM-g-MA and 400 g toluene were added into a 1000 ml vessel, and stirred to have all the above components dissolved, to form a resin composition.

Comparative Example 3

100 g polyimide resin containing anhydride and 400 g toluene were added into a 1000 ml vessel, and stirred to have all the above components dissolved, to form a resin composition.

Comparative Example 4

100 g SEBS-g-MA and 400 g toluene were added into a 1000 ml vessel, and stirred to have all the above components dissolved, to form a resin composition.

Comparative Example 5

100 g EPDM, 20 g polyphenylene ether resin with vinyl and active esters (SABIC, SA9000), 15 g maleic acid liquid polybutadiene (Cray valley Ricon, 130MA13), 5 g 1,3-bis(oxiranylmethyl)-5-(2-propenyl)-1,3,5-Triazine-2,4,6(1H,3H,5H)-trione, 1 g Bis(tert-butyldioxyisopropyl)benzene, 1 g Tetra-n-butylphosphonium O,O-Diethylphosphorodithioate, and 568 g toluene were added into a 1000 ml vessel, and stirred to have all the above components dissolved, to form a resin composition.

Comparative Example 6

100 g SEBS-g-MA, 60 g polyphenylene ether resin with vinyl and active esters (SABIC, SA9000), 15 g maleic acid liquid polybutadiene (Cray valley Ricon, 130MA13), 5 g 1,3-bis(oxiranylmethyl)-5-(2-propenyl)-1,3,5-Triazine-2,4,6(1H,3H,5H)-trione, 1 g Bis(tert-butyldioxyisopropyl)benzene, 1 g Tetra-n-butylphosphonium O,O-Diethylphosphorodithioate, and 728 g toluene were added into a 1000 ml vessel, and stirred to have all the above components dissolved, to form a resin composition.

Comparative Example 7

100 g SEBS-g-MA, 20 g polyphenylene ether resin with vinyl and active esters (SABIC, SA9000), 60 g maleic acid liquid polybutadiene (Cray valley Ricon, 130MA13), 5 g 1,3-bis(oxiranylmethyl)-5-(2-propenyl)-1,3,5-Triazine-2,4,6(1H,3H,5H)-trione, 1 g Bis(tert-butyldioxyisopropyl)benzene, 1 g Tetra-n-butylphosphonium O,O-Diethylphosphorodithioate, and 748 g toluene were added into a 1000 ml vessel, and stirred to have all the above components dissolved, to form a resin composition.

The dielectric constant and the dielectric loss of the low dielectric resin compositions made in examples 1 to 6 and the resin compositions made in the comparative examples 1 to 7 were tested. The test results are shown in Table 1.

Figure 3:
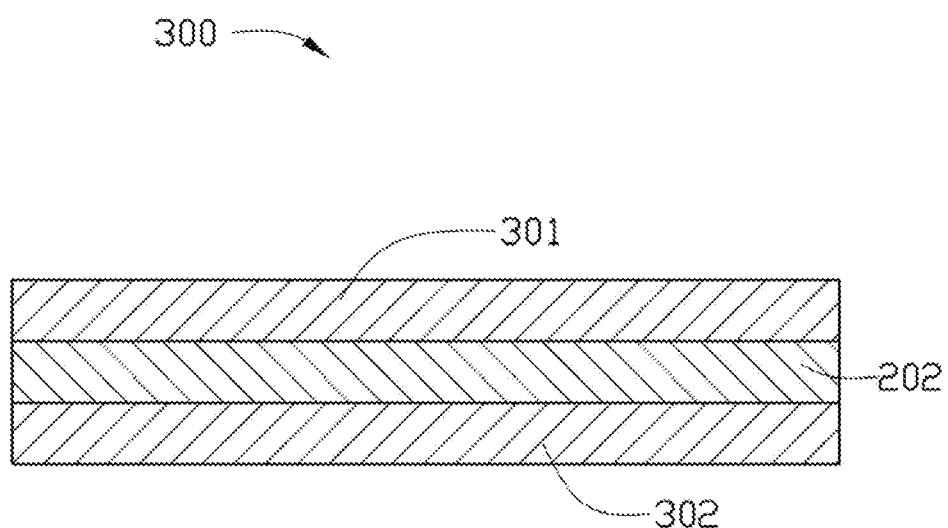
FIG. 3 is a cross-sectional view of a testing sample.

FIG. 3 illustrates a test sample 300 made by the low dielectric resin composition of the example 1. The test sample 300 was made by the steps of, first, attaching a polyimide (PI) film 301 to one surface of a resin layer 10 and attaching a copper foil 302 to the surface of the resin layer 10 opposite to the PI film 301 to form a immediate product, second, pressing the immediate product to make the PI film 301 and copper foil 302 firmly attach to the resin layer 10, and third, heating the mediate product, to have the resin layer 10 form an insulating layer 202. In at least one embodiment, the resin layer 10 used for making the test sample 300 was made from the low dielectric resin composition of the example 1.

Furthermore, twelve other test samples 300 were made by the above-described method using the low dielectric resin compositions of the examples 2 to 6 and resin compositions of the comparative examples 1 to 7, respectively.

Copper peeling strength, PI peeling strength, thermal resistance, and modulus of elasticity of the thirteen test samples 300 were tested, and the test results are shown in the Table 1. Thermal resistance was tested by, first, defining at least one through hole in the test samples 300, second, infilling molten solder into the through hole, third, heating the test samples 300 with solder at a temperature of 260 centigrade for 10 seconds and then cooling, and, fourth, repeating the third step another two times. If solder did not peel off from the through hole, the result of the thermal resistance test is a pass, otherwise, the result is fail.

6 is approximately equal to that of the test samples 300 made by the resin composition of the comparative examples 1 to 4. The thermal resistance of the test samples 300 made by the low dielectric resin composition of the examples 1 to 6 is higher than that of the test samples 300 made by the resin composition of the comparative examples 1 to 4. The dielectric constant and the dielectric loss of the resin composition of the comparative examples 5 to 7 cannot be tested. The copper peeling strength, PI peeling strength, thermal resistance, and modulus of elasticity of the test samples 300 made by the resin composition of the comparative examples 5 to 7 cannot be tested. Thus, the low dielectric resin composition has very low dielectric constant and very low dielectric loss, and has high Copper peeling strength, high PI peeling strength, and high thermal resistance.

Comparing examples 4 with 5, when the amount of the rigid cross-linking agent is high in proportion, the circuit board made by the low dielectric resin composition has a large modulus of elasticity, in other words, the hardness of the circuit board is high. Comparing examples 4 with 6, when the amount of the soft cross-linking agent is high in

TABLE 1

| | $D_k$ (10 GHz) | $D_f$ (10 GHz) | Copper peeling strength (kgf/cm) | PI peeling strength (kgf/cm) | Thermal resistance condition | Thermal resistance result | Modulus of elasticity |
|---|---|---|---|---|---|---|---|
| Example 1 | 2.11 | 0.002 | 1.15 | 1.05 | 300° C. × 10 sec | pass | 0.30 |
| Example 2 | 2.15 | 0.002 | 1.05 | 0.86 | 300° C. × 10 sec | pass | 0.21 |
| example 3 | 2.18 | 0.003 | 0.95 | 1.03 | 300° C. × 10 sec | pass | 0.20 |
| Example 4 | 2.21 | 0.003 | 1.10 | 0.95 | 300° C. × 10 sec | pass | 0.25 |
| Example 5 | 2.15 | 0.002 | 1.05 | 0.86 | 300° C. × 10 sec | pass | 0.35 |
| Example 6 | 2.18 | 0.003 | 0.95 | 1.03 | 300° C. × 10 sec | pass | 0.20 |
| Comparative example 1 | 2.10 | 0.002 | 1.01 | 0.90 | 260° C. × 10 sec | did not pass | 0.31 |
| Comparative example 2 | 2.14 | 0.002 | 0.95 | 0.81 | 260° C. × 10 sec | did not pass | 0.23 |
| Comparative example 3 | 2.12 | 0.003 | 0.88 | 0.90 | 260° C. × 10 sec | did not pass | 0.22 |
| Comparative example 4 | 2.18 | 0.003 | 0.91 | 0.80 | 260° C. × 10 sec | did not pass | 0.27 |
| Comparative example 5 | Liquid resin composition solution delaminated, because EPDM can not compatible with other components. | | | | | | |
| Comparative example 6 | Too many rigid cross-linking agents, cause the insulating layer brittle rupture. | | | | | | |
| Comparative example 7 | Too many soft cross-linking agents, cause the surface of the insulating layer has high viscosity. | | | | | | |

Table 1 illustrates that the dielectric constant and the dielectric loss of the low dielectric resin composition of the examples 1 to 6 are low, and approximately equal to the resin composition of the comparative examples 1 to 4. The copper peeling strength and the PI peeling strength of test samples 300 made by the low dielectric resin composition of the examples 1 and 4 are higher than those of the test samples 300 made by the resin composition of the comparative examples 1 to 4. The copper peeling strength of test samples 300 made by the low dielectric resin composition of the examples 2 and 5 is higher than that of the test samples 300 made by the resin composition of the comparative examples 1 to 4, and the PI peeling strength of test samples 300 made by the low dielectric resin composition of the examples 2 and 5 is approximately equal to that of the test samples 300 made by the resin composition of the comparative examples 1 to 4. The PI peeling strength of test samples 300 made by the low dielectric resin composition of the examples 3 and 6 is higher than that of the test samples 300 made by the resin composition of the comparative examples 1 to 4, and the copper peeling strength of the test samples 300 made by the low dielectric resin composition of the examples 3 and proportion, the circuit board made by the low dielectric resin composition has a small modulus of elasticity, in other words, the hardness of the circuit board is lower. Thus the hardness of the circuit board can be adjusted by varying the amounts of the rigid cross-linking agent and the soft cross-linking agent.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:
1. A circuit board comprising:
a circuit substrate; and
an insulating layer attached to at least one surface of the circuit substrate, the insulating layer is made by sticking a resin layer to the surface of the circuit substrate, and then heating the resin layer, the resin layer is made by a low dielectric resin composition, the low dielectric resin composition comprising:
a low dielectric resin containing acid anhydride;
an epoxy resin;
polyphenylene ether resin with vinyl and active esters;
maleic acid liquid polybutadiene; and
an accelerator;
wherein the low dielectric resin containing acid anhydride is selected from the group consisting of maleic anhydride graft modified resin, polyimide resin containing anhydride, and combination thereof;
wherein the dielectric constant of the low dielectric resin containing acid anhydride is less than 3 at a frequency of 10 GHz.

2. The circuit board of claim 1, wherein the low dielectric resin composition comprises: 100 parts by weight of the low dielectric resin containing acid anhydride, 5-30 parts by weight of the epoxy resin, 5-50 parts by weight of the polyphenylene ether resin with vinyl and active esters, 5-50 parts by weight of the maleic acid liquid polybutadiene, and 0.1-5 parts by weight of the accelerator.

3. The circuit board of claim 1, wherein at a frequency of 10 GHz, the low dielectric resin composition has a dielectric constant that is less than 2.4, and the polyimide has a dielectric loss that is less than 0.004.

4. The circuit board of claim 1, wherein the maleic anhydride graft modified resin is selected from the group consisting of maleic anhydride graft styrene-ethyl-butene-styrene block copolymer, maleic anhydride graft cyclo-olefin polymer, maleic anhydride graft ethylene propylene diene monomer, and any combination thereof.

5. The circuit board of claim 1, wherein the epoxy resin is selected from an epoxy resin containing more than two epoxy groups, or an epoxy resin containing vinyl.

6. The circuit board of claim 5, wherein the epoxy resin is selected from 1,3-bis(oxiranylmethyl)-5-(2-propenyl)-1,3,5-Triazine-2,4,6(1H,3H,5H)-trione, 1-(oxiranylmethyl)-3,5-di-2-propenyl-1,3,5-Triazine-2,4,6(1H,3H,5H)-trione, 1,3,5-Triglycidyl isocyanurate, 3-Benzenedimethanamine, N,N,N',N'-tetrakis(oxiranylmethyl)-1,2,2',2'',2'''-[1,2-ethanediylidenetetrakis(4,1-phenyleneoxymethylene)]tetrakis-Oxirane, or any combination thereof.

7. The circuit board of claim 1, wherein the low dielectric resin composition further comprises a thermal initiator, the low dielectric resin composition comprises 0.1-5 parts by weight of the thermal initiator.

8. The circuit board of claim 1, wherein the accelerator is selected from tertiary amine accelerator, organic phosphine derivative, or combination thereof.

9. The circuit board of claim 8, wherein the tertiary amine accelerator is selected from N,N-Dimethylbenzylamine, N,N-dimethylaniline, triethylamine, or any combination thereof.

10. The circuit board of claim 8, wherein the organic phosphine derivative is selected from Allyltri-n-butylphosphonium bromide, Dodecyltributylphosphonium bromide, ltrioctylphosphonium bromide, Tributylhexadecylphosphonium bromide, Methyltributylphosphonium iodide, Tetraethylphosphonium Bromide, Tetraethylphosphonium hydroxide, Tetrabutylphosphonium bromide, Tetra-n-butylphosphonium chloride, Tetra-n-butylphosphonium O,O-Diethylphosphorodithioate, Tetra-n-butylphosphonium Benzotriazolate, Tris(2-carboxyethyl)phosphinehydrochloride, or any combination thereof.

* * * * *

UNITED STATES PATENT AND TRADEMARK OFFICE
CERTIFICATE OF CORRECTION

PATENT NO. : 11,261,328 B2
APPLICATION NO. : 17/121616
DATED : March 1, 2022
INVENTOR(S) : Szu-Hsiang Su et al.

It is certified that error appears in the above-identified patent and that said Letters Patent is hereby corrected as shown below:

On the Title Page

Please add Item (30) regarding "Foreign Application Priority Data" as follows:
(30) Foreign Application Priority Data
Mar. 15, 2017 (TW) .................. 106108432

Signed and Sealed this
Twentieth Day of December, 2022

Katherine Kelly Vidal
*Director of the United States Patent and Trademark Office*